(12) United States Patent
Noh et al.

(10) Patent No.: US 7,372,125 B2
(45) Date of Patent: May 13, 2008

(54) PHASE CHANGE MEMORY DEVICES USING MAGNETIC RESISTANCE EFFECT, METHODS OF OPERATING AND METHODS OF FABRICATING THE SAME

(75) Inventors: Jin-Seo Noh, Seoul (KR); Tae-Sang Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 30 days.

(21) Appl. No.: 11/542,204

(22) Filed: Oct. 4, 2006

(65) Prior Publication Data
US 2007/0080384 A1    Apr. 12, 2007

(30) Foreign Application Priority Data
Oct. 6, 2005    (KR) ............... 10-2005-0093908

(51) Int. Cl.
*H01L 29/00*    (2006.01)
(52) U.S. Cl. ............... 257/529; 257/528; 257/E45.002; 438/142; 438/197; 438/238

(58) Field of Classification Search ............ None
See application file for complete search history.

(56) References Cited

U.S. PATENT DOCUMENTS

2004/0095801 A1*    5/2004    Stipe .................. 365/158

* cited by examiner

*Primary Examiner*—A. Sefer
*Assistant Examiner*—Kevin Quinto
(74) *Attorney, Agent, or Firm*—Harness, Dickey & Pierce, P.L.C.

(57) ABSTRACT

A phase change memory device includes a substrate, a switching element formed in the substrate and a storage node connected to the switching element. The storage node may include a lower electrode connected to the switching element, a first phase change layer formed on the lower electrode, a magnetic resistance layer formed on the first phase change layer, a second phase change layer formed on the magnetic resistance layer and an upper electrode formed on the second phase change layer.

39 Claims, 9 Drawing Sheets

PHASE CHANGE MEMORY DEVICES USING MAGNETIC RESISTANCE EFFECT, METHODS OF OPERATING AND METHODS OF FABRICATING THE SAME

PRIORITY STATEMENT

This non-provisional U.S. patent application claims priority under 35 U.S.C. § 119 to Korean Patent Application No.10-2005-0093908, filed on Oct. 6, 2005, in the Korean Intellectual Property Office (KIPO), the entire contents of which is incorporated herein by reference.

BACKGROUND

Description of the Related Art

A phase change memory device, such as, a phase change random access memory (PRAM), is an example of a related art nonvolatile memory device. A related art PRAM records and reads bit data using resistance characteristics of a phase change layer. These resistance characteristics are varied according to a phase of the phase change layer. Other types of related art nonvolatile memory devices are flash memories, ferroelectric random access memories (FRAM), magnetic random access memories (MRAM), and the like. A structural difference between PRAMs and other related art nonvolatile memory devices is the storage node.

FIG. 1 shows a storage node of an example related art PRAM. As shown, the related art storage node includes a lower electrode 10, a lower electrode contact layer 12, a phase change layer 14 and an upper electrode 16 as illustrated in FIG. 1. In example operation, if a reset pulse current reset is applied to the storage node for a first time period (e.g., a relatively short time period), a portion of the phase change layer 14 contacting the lower electrode contact layer 12 changes to an amorphous region 18. In this example, the resistance of the amorphous region 18 is greater than the resistance of the phase change layer 14 in a crystalline state.

In related art PRAMs having a storage node structured as illustrated in FIG. 1, a write current applied to the PRAM to form the amorphous region in the phase change layer 14 may exceed an allowable current value for a transistor of the PRAM.

Moreover, integration of related art PRAMs may be increased by reducing transistor sizes and/or storage node size. However, if the size of the transistor is reduced, a maximum current allowable in the transistor may be reduced. As a result, unless the reset current applied during a write operation of the PRAM is reduced to lower than a maximum current allowable in the transistor, increasing integration density of PRAMs may be more difficult.

According to the related art, a reset current may be reduced by reducing a width of the lower electrode contact layer in the storage node, oxidizing the lower electrode contact layer or using a higher resistance TiAlN layer for the lower electrode contact layer. However, in related art methods, production yield and/or reliability of related art PRAMs may deteriorate because a set resistance may be increased.

SUMMARY

Example embodiments relate to semiconductor memory devices, methods of operating and methods of fabricating the same, for example, semiconductor memory devices using magnetic resistance effects, methods of operating and methods of fabricating the same.

Example embodiments provide phase change memory devices capable of reducing a reset current while suppressing an increase in set resistance, methods of operating phase change memory devices and methods of fabricating phase change memory devices.

In at least one example embodiment, a phase change memory device may include a substrate, a switching element formed in the substrate and a storage node connected to the switching element. The storage node may include a lower electrode connected to the switching element, a first phase change layer formed on the lower electrode, a magnetic resistance layer formed on the first phase change layer, a second phase change layer formed on the magnetic resistance layer and an upper electrode formed on the second phase change layer.

According to at least some example embodiments, the phase change memory device may further include a lower electrode contact layer between the lower electrode and the first phase change layer. A thickness of the magnetic resistance layer may be between about 5% through about 50% of a thickness from the first phase change layer to the second phase change layer including the magnetic resistance layer.

According to at least some example embodiments, the magnetic resistance layer may include a first magnetic layer disposed on the first phase change layer, a non-magnetic layer disposed on the first magnetic layer and a second magnetic layer disposed on the non-magnetic layer. The non-magnetic layer may have a greater coercive force than that of the first magnetic layer. The lower electrode contact layer may contact the first phase change layer at a position spaced from a central portion of the first phase change layer.

According to least some example embodiments, the first phase change layer, the magnetic resistance layer, and the second phase change layer may be sequentially stacked on a portion of an upper surface of the lower electrode, and the remaining portion of the upper surface of the lower electrode may be covered with an insulating layer. In this example embodiment, the upper electrode may be formed on the insulating layer to cover the second phase change layer.

The first magnetic layer may be a ferromagnetic layer, for example, a layer selected from the group consisting of a Co layer, a Fe layer and a NiFe layer. The non-magnetic layer may be, for example, a layer selected from the group consisting of a phase change material layer, a copper (Cu) layer and a chrome (Cr) layer. The second magnetic layer may be a ferromagnetic layer, for example, a layer selected from the group consisting of a SmCo layer, a SmFe layer, a NdFeB layer and a NdFe layer.

The magnetic resistance layer may be, for example, s layer selected from the group consisting of a giant magnetic resistance (GMR) layer, a tunnel magnetic resistance (TMR) layer and a colossal magnetic resistance (CMR) layer.

At least one other example embodiment provides a method of operating a phase change memory device. In at least this example embodiment, the transistor may be maintained in an on-state and a voltage between the lower electrode and the upper electrode may be applied.

In an operating method, according to at least one example embodiment, the voltage may be a write voltage causing a reset current to flow between the upper electrode and the lower electrode.

In at least one other example embodiment, the voltage may be an erase voltage causing a set current to flow between the upper electrode and the lower electrode.

In at least one other example embodiment, the voltage may be a read voltage applied to measure a resistance of the storage node and read data recorded in the storage node. In this example, the resistance of the storage node may be measured by applying the read voltage, and the measured resistance may be compared with a reference resistance. The recorded data may be read from the storage node as 1 or 0.

At least one other example embodiment provides a method of fabricating a phase change memory device. In the method of fabricating, a switching element may be formed in a substrate, and a first insulating interlayer may be formed to cover the switching element. A contact hole exposing the switching element may be formed in the first insulating interlayer, and the contact hole may be filled with a conductive plug. A lower electrode may be formed to cover the conductive plug on the first insulating interlayer. A second insulating interlayer may be formed to cover the lower electrode on the first insulating interlayer. A via hole may be formed to expose the lower electrode in the second insulating interlayer, and the via hole may be filled with a lower electrode contact layer. A first phase change layer, a magnetic resistance layer, a second phase change layer and an upper electrode covering the lower electrode contact layer may be stacked.

According to at least some example embodiments, the first phase change layer may be formed such that the lower electrode contact layer contacts the first phase change layer at a position spaced from a central portion of the first phase change layer.

At least one other example embodiment provides a method of fabricating a phase change memory device. In this example embodiment, a switching element may be formed in a substrate, and a first insulating interlayer may be formed to cover the switching element on the substrate. A contact hole exposing the switching element may be formed in the first insulating interlayer. The contact hole may be filled with a conductive plug, and a lower electrode may be formed to cover the conductive plug on the first insulating interlayer. A first phase change layer, a magnetic resistance layer and a second phase change layer may be stacked on a portion of an upper surface of the lower electrode. An insulating layer may be formed to cover the lower electrode, and the first phase change layer, the magnetic resistance layer and the second phase change layer on the first insulating interlayer may be covered. An upper surface of the insulating layer may be polished until the second phase change layer is exposed, and an upper electrode covering the second phase change layer may be formed on the polished insulating layer.

In a fabricating method, according to at least some example embodiments, the first phase change layer may be formed such that the lower electrode contacts the first phase change layer at a position spaced from a central portion of the first phase change layer. The magnetic resistance layer may be formed by sequentially stacking a first magnetic layer, a non-magnetic layer and a second magnetic layer on the first phase change layer. In at least this example embodiment, the first magnetic layer may be a ferromagnetic layer, and may be one layer selected from the group consisting of a Co layer, a Fe layer, a NiFe layer, and a CoFe layer. The non-magnetic layer may be one layer selected from the group consisting of a phase change material layer, a copper (Cu) layer, and a chrome (Cr) layer. The second magnetic layer may be a ferromagnetic layer, and may be one layer selected from the group consisting of a SmCo layer, a SmFe layer, a NdFeB layer, and a NdFe layer.

In at least some example embodiments, the magnetic resistance layer may be formed with a thickness of about 5% through about 50% of a thickness from the first phase change layer to the second phase change layer including the magnetic resistance layer. The magnetic resistance layer may be one layer selected from the group consisting of a giant magnetic resistance (GMR) layer, a tunnel magnetic resistance (TMR) layer, and a colossal magnetic resistance (CMR) layer.

BRIEF DESCRIPTION OF THE DRAWINGS

Example embodiments will become more apparent by describing in detail the attached drawings in which.

DETAILED DESCRIPTION OF EXAMPLE EMBODIMENTS

Figure 1:
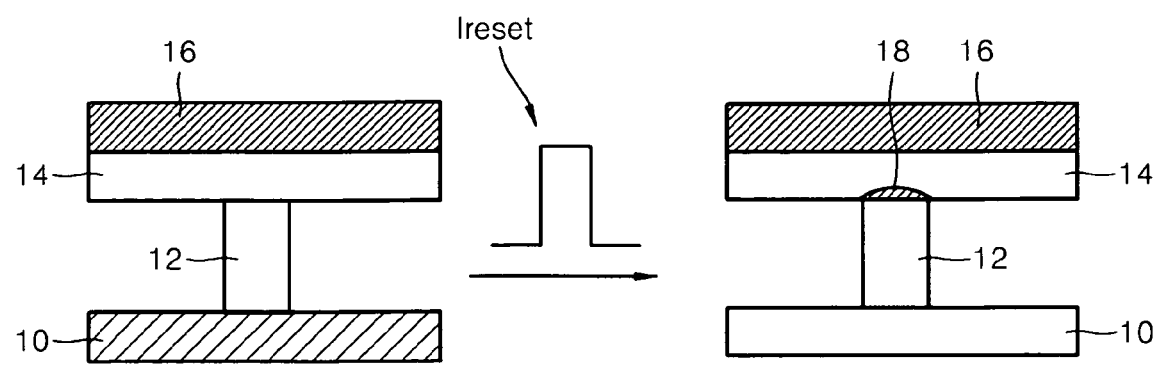
FIG. 1 is sectional views illustrating a storage node of a related art phase change memory device before and after a reset current is applied.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Figure 2:
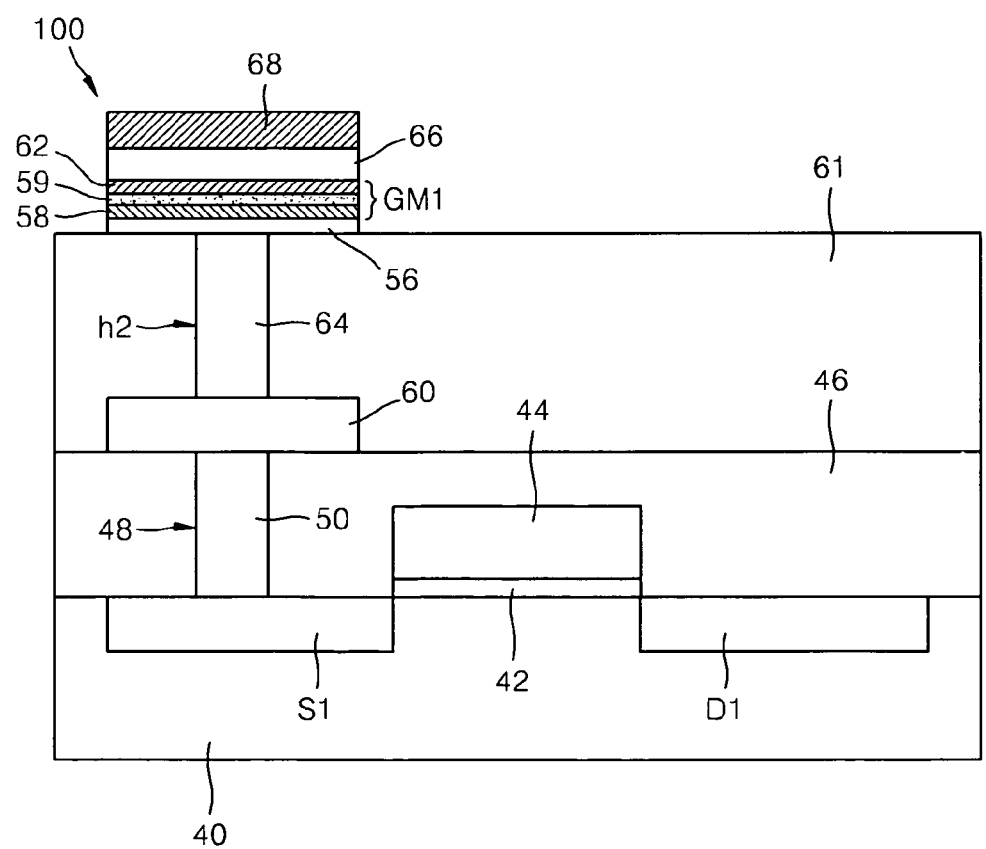
FIG. 2 is a sectional view illustrating a phase change memory device, according to an example embodiment.

FIG. 2 is a sectional view illustrating a phase change memory device using a magnetic resistance effect, according to an example embodiment.

Referring to FIG. 2, first impurity region S1 and second impurity region D1 may be formed spaced apart from each other in a substrate 40. The first impurity region S1 and the second impurity region D1 may be doped with conductive impurities, for example, n-type impurities. The substrate 40 may be a substrate doped with conductive impurities having a polarity opposite to that of the conductive impurities doping the first and second impurity regions S1 and D1. For example, the substrate 40 may be a p-type silicon substrate. Alternatively, however, the first impurity region S1 and the second impurity region D1 may be doped with p-type conductive impurities and the substrate 40 may be doped with conductive impurities such as n-type impurities. The first and second impurity regions S1 and D1 may have different shapes. One of the first and second impurity regions S1 and D1 (e.g., the first impurity region S1) may be a source region, and the other (e.g., the second impurity region D1) may be a drain region.

A gate oxide layer 42 and a gate electrode 44 may be stacked (e.g., sequentially stacked) on the substrate 40 between the first and second impurity regions S1 and D1. The substrate 40, the first and second impurity regions S1 and D1, and the gate electrode 44 may constitute a field effect transistor (FET). Although only a single transistor is shown in FIG. 2, example embodiments may include a plurality of transistors.

A first insulating interlayer 46 may be formed on the substrate 40 to cover the transistor. A contact hole 48 may be formed through the first insulating interlayer 46 exposing the first impurity region S1. Alternatively, the contact hole 48 may be formed at the position where the second impurity region D1 is exposed instead of the first impurity region S1. The contact hole 48 may be filled with a conductive plug 50. A lower electrode 60 may be formed on the first insulating interlayer 46 to cover an exposed upper surface of the conductive plug 50. The lower electrode 60 may also function as a pad layer. The lower electrode 60 may be, for example, a TiN electrode or a TiAlN electrode. However, the lower electrode 60 may be formed of a material other than the above. A second insulating interlayer 61 covering the lower electrode 60 may be formed on the first insulating interlayer 46. The second insulating interlayer 61 may be formed of the same or substantially the same material as that of the first insulating interlayer 46. A contact hole h2 may be formed through the second insulating interlayer 61 exposing an upper surface of the lower electrode 60. The contact hole h2 may be filled with a lower electrode contact layer 64.

A first phase change layer 56 may be formed on the second insulating interlayer 61 to cover the exposed upper surface of the lower electrode contact layer 64. The first phase change layer 56 may be, for example, a GST layer. However the first phase change material layer may be a phase change material layer other than the GST layer.

For example, the first phase change material layer 56 may include chalcogenide alloys such as germanium-antimony-tellurium (Ge—Sb—Te), arsenic-antimony-tellurium (As—Sb—Te), tin-antimony-tellurium (Sn—Sb—Te), tin-indium-antimony-tellurium (Sn—In—Sb—Te), or arsenic-germanium-antimony-tellurium (As—Ge—Sb—Te). Alternatively, the first phase change material layer 56 may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the first phase change material layer 56 may include an element in Group VIA-antimony-tellurium such as tungsten-antimony-tellurium (W—Sb—Te), molybdenum-antimony-tellurium (Mo-Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the first phase change material layer 56 is described above as being formed primarily of ternary phase-change chalcogenide alloys, the chalcogenide alloy of the first phase change material layer 56 could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$, Ge—In—Sb—Te, or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

In an example embodiment, the first phase change material layer 56 may be made of a transition metal oxide having multiple resistance states, as described above. For example, the first phase change material layer 56 may be made of at least one material selected from the group consisting of NiO, $TiO_2$, HfO, $Nb_2O_5$, ZnO, $WO_3$, and CoO or GST ($Ge_2Sb_2Te_5$) or PCMO($Pr_xCa_{1-x}MnO_3$). The first phase change material layer 56 may be a chemical compound including one or more elements selected from the group consisting of S, Se, Te, As, Sb, Ge, Sn, In, N, Si, C and Ag.

Returning to FIG. 2, a magnetic resistance layer GM1 may be formed on the first phase change layer 56. The magnetic resistance layer GM1 may be a giant magnetic resistance (GMR) layer or the like. The magnetic resistance layer GM1 may include a first magnetic layer 58 formed on the first phase change layer 56, a non-magnetic layer 59 and a second magnetic layer 62, which may be stacked (e.g., sequentially) on the first magnetic layer 58. The first magnetic layer 58 may be formed of a ferromagnetic material having a magnetic polarization that is variable or reversible with respect to an external magnetic field. For example, the external magnetic field may be a magnetic field resulting from a reset current. The magnetic polarization of the first magnetic layer 58 may return to an original magnetic polarization state when the external magnetic field is no longer present.

In at least one example embodiment, the first magnetic layer 58 may be one selected from the group consisting of a Co layer, a Fe layer, a NiFe layer, a CoFe layer, a combination thereof, or the like. The non-magnetic layer 59 may be formed to suppress (e.g., prevent) magnetic coupling of the first and second magnetic layers 58 and 62, and may be one selected from the group consisting of a phase change material layer, a copper (Cu) layer, a chrome (Cr) layer, a combination thereof or the like. The second magnetic layer 62 may be a ferromagnetic layer having a greater (e.g., substantially greater) coercive force as compared to that of the first magnetic layer 58, and may be one selected from, for example, the group consisting of a SmCo layer, a SmFe layer, a NdFeB layer, a NdFe layer, a combination thereof or the like.

The second magnetic layer 62 may be a pinned magnetic layer, having a fixed magnetic polarization. The magnetic polarization of the second magnetic layer 62 may not be reversed by a magnetic field generated by a current flowing through the first phase change layer 56 in relation to the operation of the phase change memory device, such as a reset current or a set current, or a magnetic field externally generated out of a storage node 100. A resistance of the magnetic resistance layer GM1 may be increased or decreased in accordance with a magnetic polarization direction of the first magnetic layer 58.

Alternatively, the magnetic resistance layer GM1 may be one of a tunnel magnetic resistance (TMR) layer and a colossal magnetic resistance (CMR) layer in addition to the giant magnetic resistance (GMR) layer.

Referring still to FIG. 2, a second phase change layer 66 may be disposed on the magnetic resistance layer GM1. The second phase change layer 66 may be thicker than the first phase change layer 56, and may be formed of the same or substantially the same phase change material layer as that of the first phase change layer 56. An upper electrode 68 may be formed on the second phase change layer 66. Similar to that as discussed above with regard to the first phase change material layer 56, the second phase change material layer 66 may be comprised of any suitable phase change material.

Figure 3A:
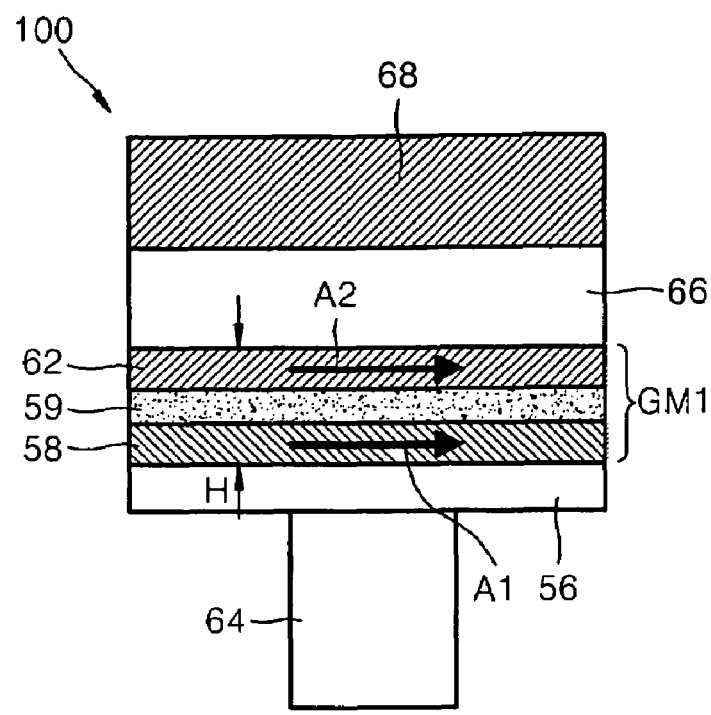
FIGS. 3A and 3B are enlarged views illustrating a storage node, according to an example embodiment.

FIG. 3A is an enlarged view illustrating the storage node 100 of the phase change memory device of FIG. 2. For the sake of clarity, the lower electrode 60 has been omitted from FIG. 3A. FIG. 3A shows a storage node 100 in which the magnetic polarization directions A1 and A2 of the first and second magnetic layers 58 and 62, respectively, are same.

In at least this example embodiment, an initial state of the memory device may be a first state or a second state. In the first state, the magnetic polarization direction A1 of the first magnetic layer 58 may be opposite to the magnetic polarization direction A2 of the second magnetic layer 62. In the second state, the magnetic polarization directions A1 and A2 of the first and second magnetic layers 58 and 62, respectively, may be the same. According to at least some example embodiments, setting the initial state as the first state may be more difficult and/or complex than setting the initial state to the second state.

For example, to set the initial state as the first state, the magnetic polarization directions A1 and A2 of the first and second magnetic layers 58 and 62 are set to a given direction, for example, by flowing a first current to the storage node 100 or exposing the storage node 100 to an external magnetic field. A second current is then applied to the storage node 100 to set the magnetic polarization direction A1 of the first magnetic layer 58 to a direction opposite to that of the magnetic polarization direction A2 of the second magnetic layer 62. The second current may be in a direction opposite to that of the first current and/or the magnitude of the second current may be less than the magnitude of the first current.

To set the initial state of the memory device to the second state (e.g., as illustrated in FIG. 3A), only a first current need be flowed through the storage node 100 or the storage node 100 need only be exposed to an external magnetic field.

As described above, setting the initial state of the memory device to the second state may be simpler than setting the initial state to the first state.

Figure 3B:
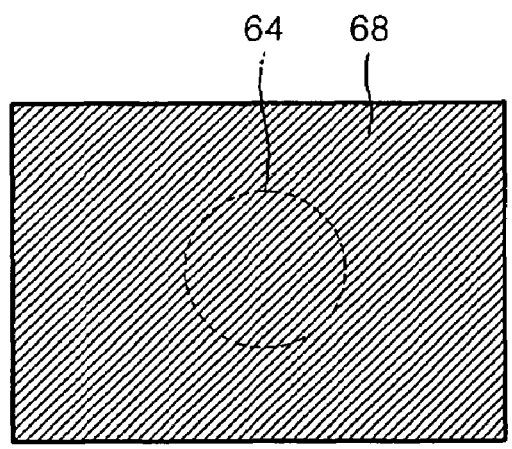

Referring still to FIG. 3A, a thickness H of the magnetic resistance layer GM1 may be about 5% through about 50% of a total thickness from the first phase change layer 56 to the second phase change layer 66, for example, about 10 nm (100 Å). The first magnetic layer 58, the non-magnetic layer 59 and/or the second magnetic layer 62 may have thicknesses in a range so as to satisfy the total thickness of the magnetic resistance layer GM1. For example, each of the first and second magnetic layers 58 and 62 may have a thickness of about 30 Å through about 50 Å. The non-magnetic layer 59 may have a thickness of less than or equal to about 40 Å. FIG. 3B is a plan view illustrating the storage node 100 of FIG. 3A. As illustrated in FIG. 3B, the lower electrode contact layer 64 may be formed at the center of the upper electrode 68. Because the first phase change layer 56, the magnetic resistance layer GM1, the second phase change layer 66 and the upper electrode 68 may be stacked (e.g., sequentially), the positioning of the lower electrode contact layer 64 at the center of the upper electrode 68 as illustrated in FIG. 3B results in the lower electrode contact layer 64 contacting the center of the first phase change layer 56. However, this may not influence operation of the storage node. Thus, the lower electrode contact layer 64 may contact any portion of the first phase change layer 56.

Figure 4A:
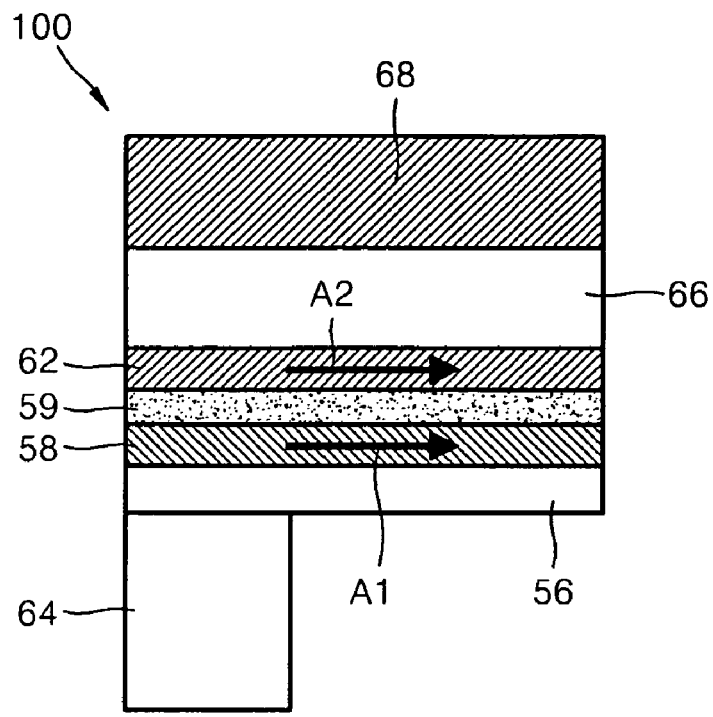
FIGS. 4A and 4B are sectional views illustrate a storage node, according to another example embodiment.
Figure 4B:
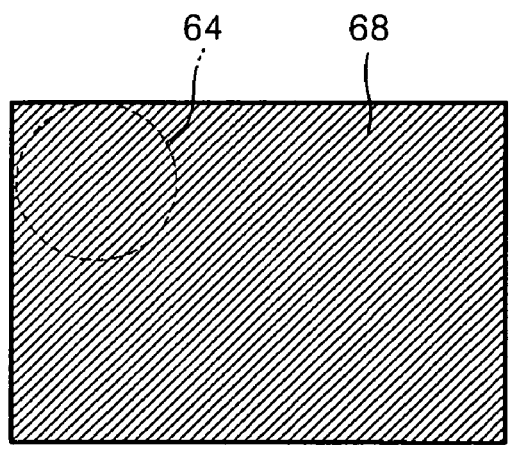

FIGS. 4A and 4B illustrate a storage node, according to another example embodiment, in which the lower electrode contact layer 64 contacts a corner of the first phase change layer 56. The storage node of FIGS. 4A and 4B may be similar or substantially similar to the storage node of FIGS. 3A and 3B, however, the in FIGS. 4A and 4B, the lower electrode contact layer 64 may contact a corner of the first phase change layer 56 instead of the center of the first phase change layer 56.

Figure 5A:
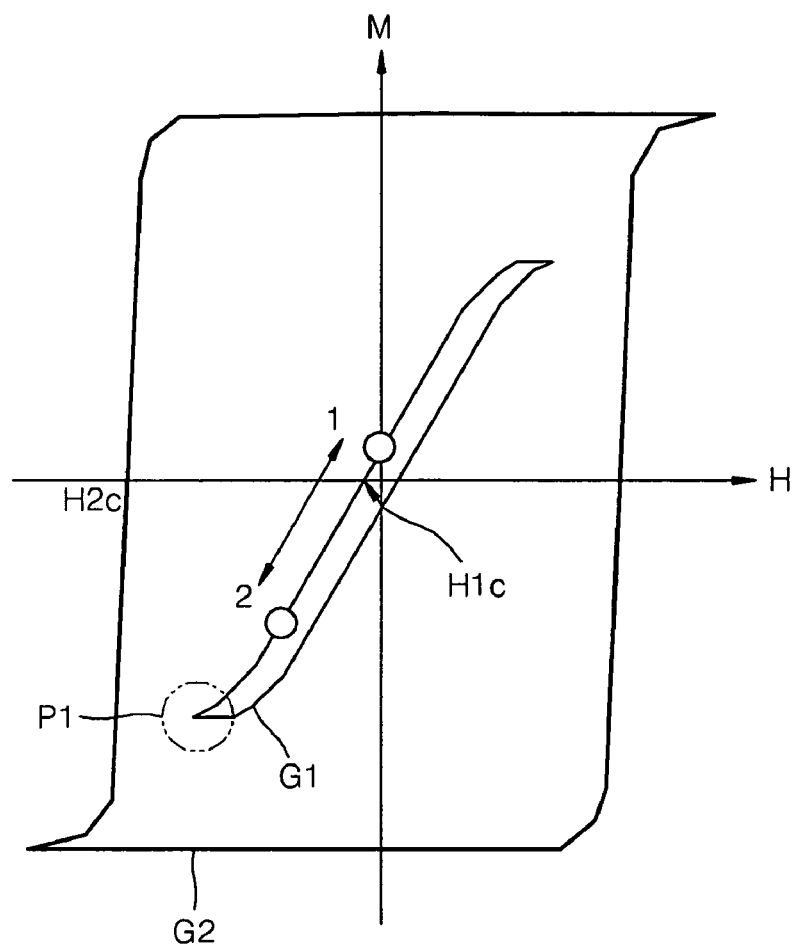
FIG. 5A is a graph illustrating hysteresis characteristics of a magnetic resistance layer in the storage node of a phase change memory device, according to an example embodiment.
Figure 5B:
FIGS. 5B and 5C are sectional views illustrating a change in magnetic polarization direction of a lower magnetic layer in a magnetic resistance layer relative to hysteresis characteristics for a phase change memory device, according to an example embodiment.

FIG. 5A illustrates magnetic hysteresis characteristics of first and second magnetic layers 58 and 62, according to an example embodiment. FIG. 5B illustrates a change in magnetic polarization direction of the first magnetic layer 58 in accordance with the hysteresis characteristics of the first magnetic layer 58 as a soft magnetic layer.

A first graph G1 of FIG. 5A illustrates the magnetic hysteresis characteristics of the first magnetic layer 58 as a relatively soft magnetic layer, and a second graph G2 of FIG. 5A illustrates the magnetic hysteresis characteristics of the second magnetic layer 62 as a relatively hard magnetic layer.

In comparison of the first and second graphs G1 and G2 of FIG. 5A, a coercive force H1c of the first graph G1 is lower than a coercive force H2c of the second graph G2. Further, the first graph G1 is disposed inside the second graph G2, and is inclined diagonally toward the right. Thus, even though the second magnetic layer 62 may be subjected to a magnetic field strong enough to completely reverse the magnetic polarization of the first magnetic layer 58, the magnetic polarization of the second magnetic layer 62 may not be reversed. Further, the magnetic polarization direction of the first magnetic layer 58 may be the same or substantially the same as the magnetic polarization direction of the second magnetic layer 62 in a first point 1 of the first graph G1. In a second point 2 of the first graph G1, the magnetic polarization direction of the first magnetic layer 58 is opposite to the magnetic polarization direction of the second magnetic layer 62. The state of the first magnetic layer 58 at the second point 2 of the first graph G1 may be the same or substantially the same when a reset current is applied to the storage node 100 of the memory device. At this time, an intensity of the magnetic field generated by the reset current may be lower than an intensity of a saturated magnetic field capable of completely reversing a magnetic polarization of the first magnetic layer 58.

When the first magnetic layer 58 is subjected to a saturated magnetic field, a magnetic polarization state of the first magnetic layer 58 may correspond to a state of lower point P1 in the first graph G1. When the magnetic polarization state of the first magnetic layer 58 is in a state corresponding to the lower point P1 of the first graph G1, the magnetic polarization state of the first magnetic layer 58 may not return to the state corresponding to the first point 1 in the first graph G1, for example, the state that the magnetic polarization directions of the first and second magnetic layers 58 and 62 are the same or substantially the same, but instead may maintain the state in which the magnetic polarization direction of the first magnetic layer 58 is opposite to the magnetic polarization direction of the second magnetic layer 62.

However, as described above, because the intensity of the magnetic field generated by the reset current applied to the storage node is lower than the intensity of the saturated magnetic field, a magnetic polarization state of the first magnetic layer 58 while the reset current is applied to the storage node 100 may be in a state corresponding to the second point 2. Thus, when the applied reset current is stopped, the magnetic polarization state of the first magnetic layer 58 may return to a state corresponding to first point 1 from the second point 2. For example, when the reset current applied to the storage node 100 is stopped, the magnetic polarization direction of the first magnetic layer 58 may return to the initial state before the reset current is applied so that the magnetic polarization direction of the first magnetic layer 58 becomes the same or substantially the same as the magnetic polarization direction of the second magnetic layer 62 as illustrated in FIG. 5B.

Figure 5C:

FIG. 5C illustrates a magnetic polarization direction of the first magnetic layer 58 with respect to a magnetic polarization direction of the second magnetic layer 62 when the magnetic polarization state of the first magnetic layer 58 is in a state corresponding to the second point 2 in the first graph G1.

A method of operating the memory device of the present invention as described above will be explained.

Figure 6A:
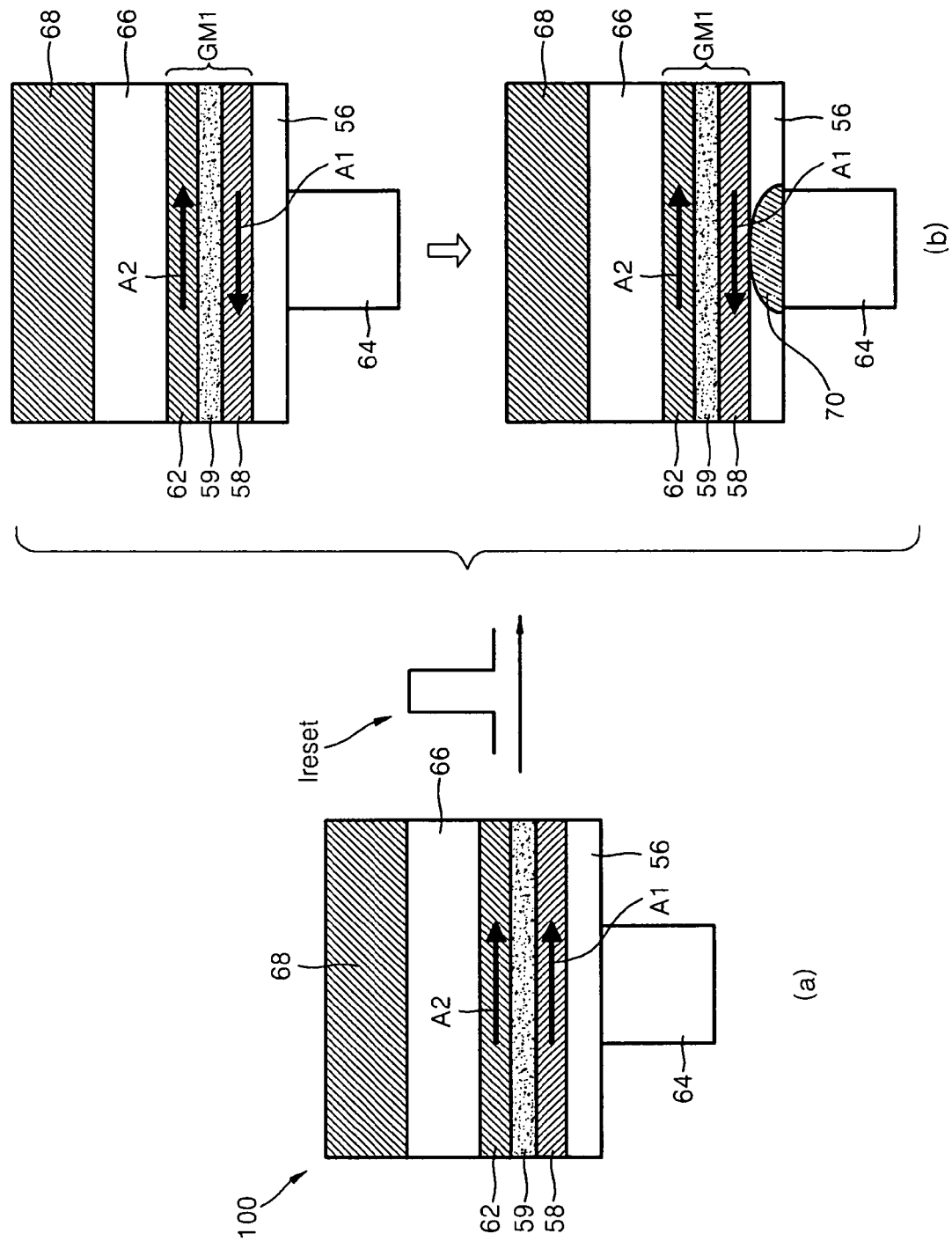
FIGS. 6A and 6B are sectional views illustrating a method of operating a phase change memory device, according to an example embodiment.

As shown in (a) of FIG. 6A, a reset pulse current Ireset may be applied to the storage node 100 of a memory device for a first period time. The storage node 100 may be in an initial state before the reset current Ireset is applied. In this example, the initial state of the storage node 100 may include magnetic polarization directions A1 and A2 of the first and second magnetic layers 58 and 62, which are the same.

When the reset current Ireset is applied to the storage node 100, the magnetic polarization direction A1 of the first magnetic layer 58 may become opposite to the magnetic polarization direction A2 of the second magnetic layer 62 because of the influence of the magnetic field generated from the reset current Ireset as illustrated in (b) of FIG. 6A.

Because the reaction of the first magnetic layer 58 to the magnetic field generated from the reset current Ireset occurs almost concurrently upon the reset current Ireset applied, a time of the reaction may be shorter than the applied time (e.g., several nanoseconds) of the reset current Ireset. Thus, the magnetic polarization directions A1 and A2 of the first and second magnetic layers 58 and 62 may become opposite to each other before a portion 70 of the first phase change layer 56 contacting the lower electrode contact layer 64 is heated by joule heat when the reset current is applied. When the magnetic polarization directions A1 and A2 of the first and second magnetic layers 58 and 62 become opposite, the portion of the first phase change layer 56 contacting the lower electrode contact layer 64 may undergo joule-heating. As a result, the reset current Ireset flowing through the magnetic resistance layer GM1 receives electrical resistance from the first magnetic layer 58 and also receives electrical resistance from the second magnetic layer 62 in the state that the magnetic polarization directions A1 and A2 of the first and second magnetic layers 58 and 62 become opposite to each other.

For example, the reset current Ireset may include electrons upward in spin polarization and electrons downward in spin polarization at the same or substantially the same rates, respectively. While most of electrons downward in spin polarization pass through the first magnetic layer 58 relatively easily, at least a portion of (e.g., most) electrons upward in spin polarization may not pass through the first magnetic layer 58 because of the magnetic polarization state of the first magnetic layer 58, but may be reflected.

At least a portion (e.g., most) of electrons downward in spin polarization passing the first magnetic layer 58 may not pass through the second magnetic layer 62 having a magnetic polarization direction opposite to that of the first magnetic layer 58, and may be reflected.

As a result, an electric resistance of the magnetic resistance layer GM1 may increase as compared to when the magnetic polarization directions A1 and A2 of the first and second magnetic layers 58 and 62 are the same. Thus, a joule heat generated from the magnetic resistance layer GM1 when the reset current Ireset is applied may increase as compared to when the phase change layer exists at the position of the magnetic resistance layer GM1 instead of the magnetic resistance layer GM1. As a result, the reset current Ireset applied to memory devices may decrease as compared to the related art.

Referring still to FIG. 6A, a portion of the first phase change layer 56 contacting the lower electrode contact layer 64 may change to an amorphous region 70 as illustrated in (b) of FIG. 6A because of heat generated from the magnetic resistance layer GM1 and the first phase change layer 56 when the reset current Ireset is applied.

Figure 6B:
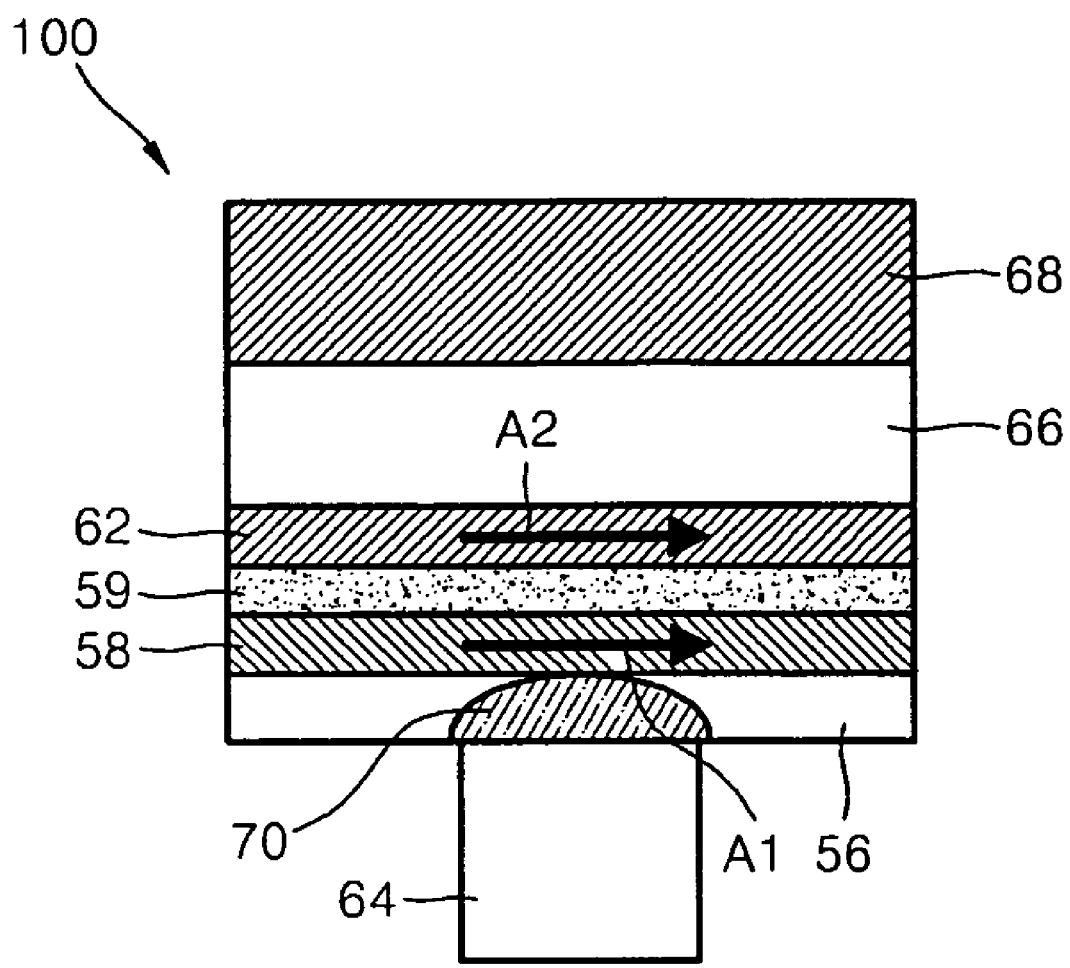

Because an intensity of the magnetic field generated by the reset current Ireset may be lower than an intensity of the saturated magnetic field of the first magnetic layer 58, the magnetic polarization direction A1 of the first magnetic layer 58 may return to an initial state after the reset current Ireset is applied as explained with respect to FIGS. 5A and 5B so that the magnetic polarization direction A1 of the first magnetic layer 58 becomes the same as the magnetic polarization direction A2 of the second magnetic layer 62. FIG. 6B illustrates the above described result.

As described above, if the amorphous region 70 exists in the portion of the first phase change layer 56 contacting the lower electrode contact layer 64 by the application of the reset current Ireset, after the reset current Ireset is applied, even though the magnetic polarization direction A1 of the first magnetic layer 58 becomes same as the magnetic polarization direction A2 of the second magnetic layer 62, a resistance of the storage node may increase as compared to the resistance thereof before the reset current Ireset is applied. In at least one example embodiment, bit data 1 may be recorded when the resistance of the storage node is higher after the reset current Ireset is applied, whereas bit data 0 may be recorded in the memory device, when the magnetic polarization directions A1 and A2 of the first and second magnetic layers 58 and 62 are the same, and the amorphous region 70 does not exist in the first phase change layer 56. Alternatively, bit data 0 may be recorded when the resistance of the storage node is higher after the reset current Ireset is applied, whereas bit data 1 may be recorded in the memory device, when the magnetic polarization directions A1 and A2 of the first and second magnetic layers 58 and 62 are the same, and the amorphous region 70 does not exist in the first phase change layer 56.

A method for reading recorded bit data, according to an example embodiment, will now be described.

The transistor may be maintained in an on-state. A resistance of the storage node 100 may be measured by applying a read voltage between the lower electrode 60 and the upper electrode 68. The measured resistance may be compared to a reference resistance. In this example, as a result of comparison, when the measured resistance is higher than the reference resistance, bit data 1 may be read. When the measured resistance is lower than the reference resistance, bit data 0 may be read.

An erase operation may be performed by applying a set current to the storage node 100 in a state that the transistor is maintained in an on-state. At this time, the set current may be lower than the reset current. However, a period of time during which the set current is applied may be longer than a time period during which the reset current Ireset is applied. When the amorphous region 70 exists in the storage node 100, the amorphous region 70 may be changed to the original crystalline structure by the heat generated when the set current is applied.

As such, because the magnetic polarization direction of the first magnetic layer 58 may be changed when the set current is applied during an erasing process, and heat may be generated in the magnetic resistance layer GM1 along with the first phase change layer 56, the set current may be reduced in a manner similar or substantially similar to the example in which the reset current Ireset is applied.

An example simulation to check the reduction of a reset current in memory devices, according to example embodiments, will now be described.

In this example simulation, the lower electrode contact layer 64 of the storage node is disposed at a corner of the first phase change layer 56 as illustrated in FIG. 4, not at the center of the first phase change layer 56. Further, the first and second phase change layers 56 and 66 of the storage node and the magnetic resistance layer GM1 illustrated in FIG. 4 are replaced with GST layers and a 10 nm-strip having giant magnetic resistance efficiency. In the preparation of a related art storage node to be compared with the above-described storage node, according to an example embodiment, only a GST layer is provided between the upper and lower electrodes.

A separate simulation is performed using the storage node, according to an example embodiment, and a related art storage node to examine change of a reset current in accordance with change of a giant magnetic resistance efficiency.

In a first simulation, a reset current is measured in the state that a giant magnetic resistance efficiency of the storage node, according to an example embodiment, is set to about 30%, and other conditions are the same as those of the second simulation. In a second simulation, a reset current is measured in the state that a giant magnetic resistance efficiency of the storage node, according to an example embodiment, is set to about 50%, and other conditions are made same as those of the first simulation.

Results of the first and second simulations are shown in Table 1 as follows.

TABLE 1

| Division | reset current (mA) | |
| --- | --- | --- |
|  | storage node of the present invention | conventional storage node |
| first simulation | 1.216 | 1.295 |
| second simulation | 1.175 | 1.295 |

As shown in Table 1, the reset currents of the storage node, according to an example embodiment, are lower than those of the related art storage node all in the first and second simulations. Further, when only the storage node, according to an example embodiment, is considered, the reset current of the storage node in the second simulation is lower than that of the storage node in the first simulation.

Thus, the reset current of the phase change memory device, according to an example embodiment, is lower than that of the related art phase change memory device. Further, when only the phase change memory device, according to an example embodiment, is considered, the reset current is reduced when the giant magnetic resistance efficiency of the storage node is higher.

A method of fabricating the memory device according to an example embodiment will be explained.

Figure 7:
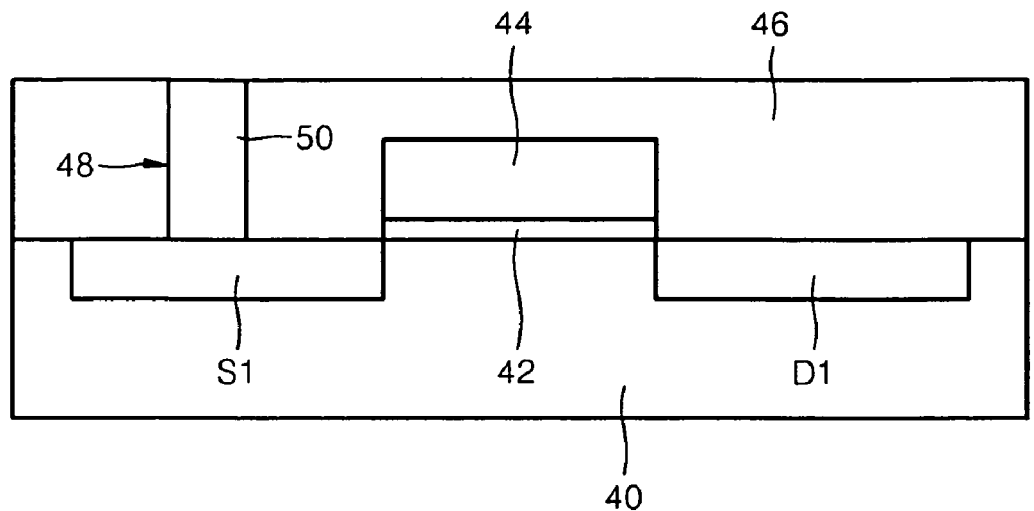
FIGS. 7 through 11 are sectional views illustrating a method of fabricating a phase change memory device, according to an example embodiment.

Referring to FIG. 7, an active region and a field region may be defined and/or formed in a substrate 40. Device elements may be formed in the active region, and device elements may not be formed in the a field region. The substrate 40 may be formed of silicon into which, for example, p-type conductive impurities may be implanted. A field oxide layer (not shown) may be formed in the field region for isolation. A gate oxide layer 42 and a gate electrode 44 may be formed (e.g., sequentially) on a portion of the active region of the substrate 40. The active region may be doped with conductive impurities having a polarity opposite to that of the impurities in the substrate 40, for example, n-type impurities, using the gate electrode 44 as a mask. First and second impurity regions S1 and D1 may be formed, and may be separated by the gate electrode 44. The first and second impurity regions S1 and D1 may be formed with a lightly doped drain (LDD) type. One of the first and second impurity regions S1 and D1 may be a source region, and the other may be a drain region. Thus, a field effect transistor may be formed in the substrate 40. The field effect transistor may be a switching element, and may be replaced with other switching elements, such as a diode or the like.

A first insulating interlayer 46 may be formed on the substrate 40 to cover the transistor and a contact hole 48 may be formed through the first insulating interlayer 46 to expose the first impurity region S1. Alternatively, the contact hole 48 may be formed at a position exposing the second impurity region D1 instead of, or in addition to, the first impurity region S1. After a conductive material (not shown) is stacked on the first insulating interlayer 46 to fill the contact hole 48, an upper surface of the conductive material may be planarized until the first insulating interlayer 46 is exposed. The contact hole 48 may be filled with a conductive plug 50.

Figure 8:
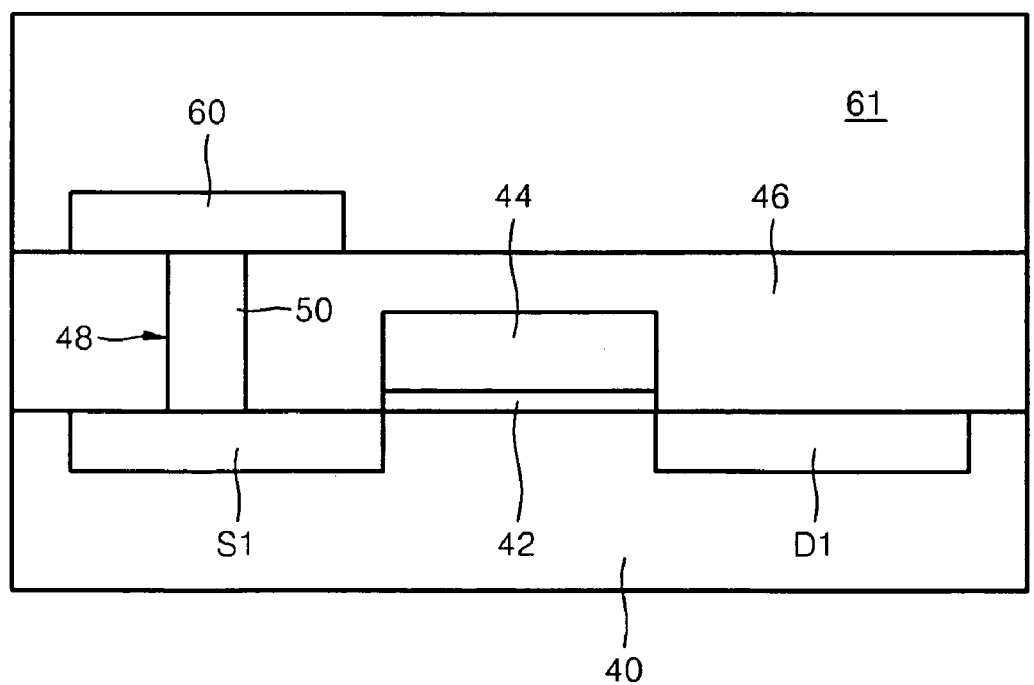

Referring to FIG. 8, a lower electrode 60 may be formed on the first insulating interlayer 46 to cover an exposed upper surface of the conductive plug 50. A second insulating interlayer 61 may be formed on the first insulating interlayer 46 to cover the lower electrode 60 and an upper surface of the first insulating interlayer 46. The second insulating interlayer 61 may be composed of the same or substantially the same material as that of the first insulating interlayer 46.

Figure 9:
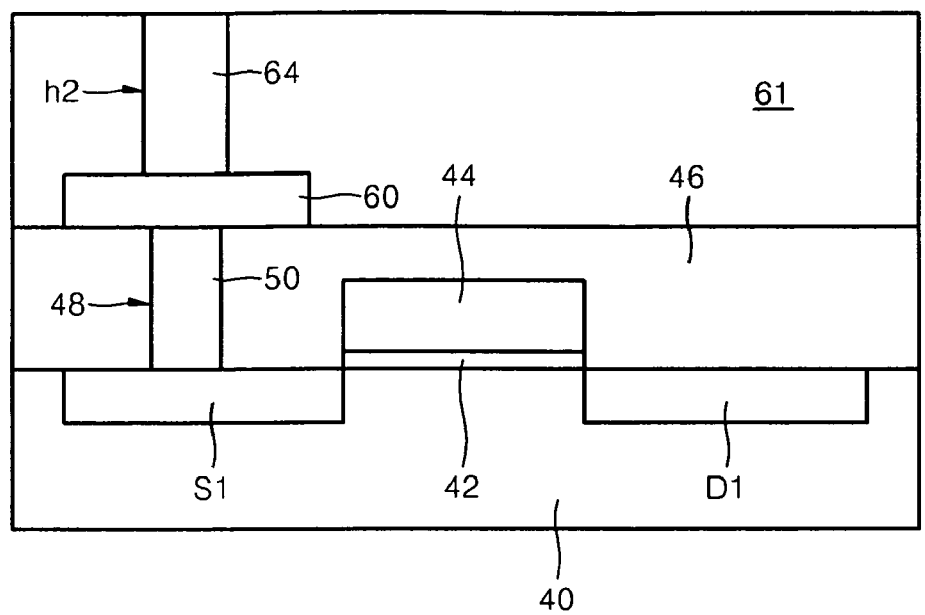

As illustrated in FIG. 9, a via hole h2 may be formed in the second insulating interlayer 61 to expose the lower electrode 60 and the via hole h2 may be filled with a lower electrode contact layer 64. The lower electrode contact layer 64 may be formed of, for example, a TiN layer or a TiAlN layer, or a similarly conductive layer. During the process of forming the lower electrode contact layer 64, an upper surface of the lower electrode contact layer 64 may be formed recessed or flat.

Figure 10:
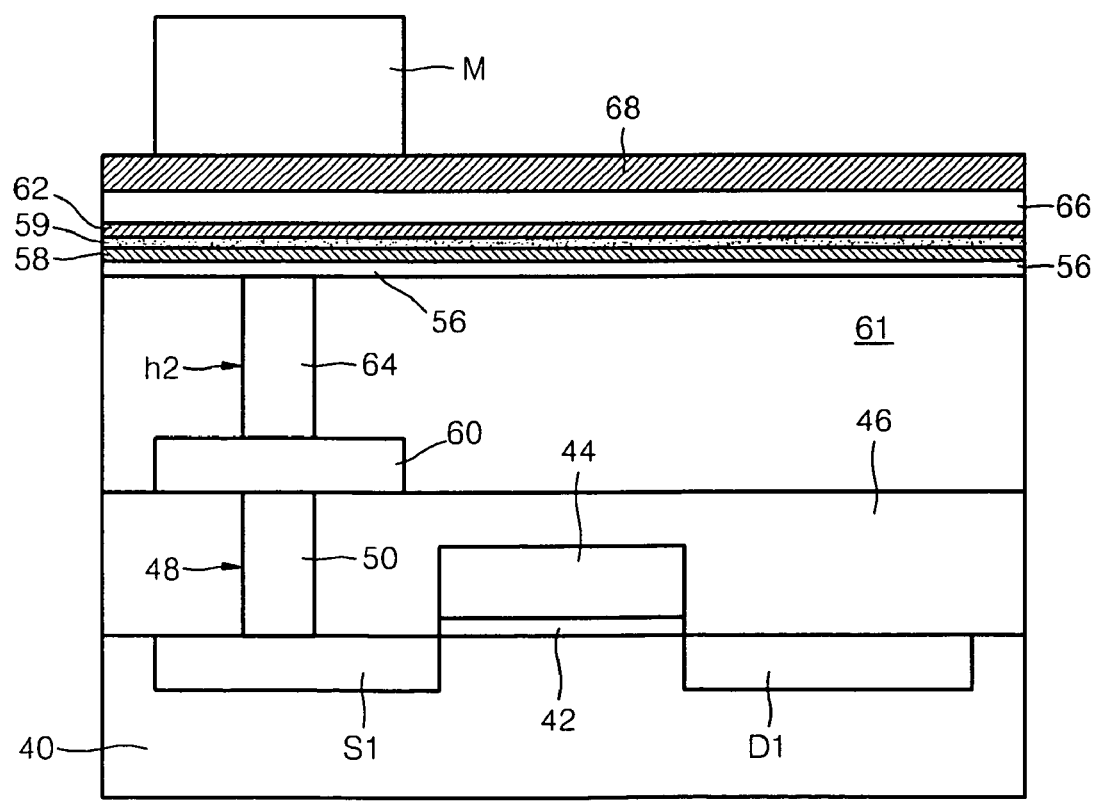

Referring to FIG. 10, a first phase change layer 56 may be formed on an upper surface of the second insulating interlayer 61 to cover the exposed surface of the lower electrode contact layer 64. The first phase change layer 56 may be formed of, for example, a GST or other similar layer. A first magnetic layer 58, a non-magnetic layer 59 and a second magnetic layer 62 may be formed (e.g., sequentially) on the first phase change layer 56. The first and second magnetic layers 58 and 62 may be ferromagnetic layers formed of a magnetic material layer. The non-magnetic layer 59 may be formed of the material as described above. The first magnetic layer 58, the non-magnetic layer 59 and the second magnetic layer 62 may form or constitute a magnetic resistance layer. The magnetic resistance layer may be formed with a thickness of about 5% through about 50% of the thickness from the first phase change layer 56 to a second phase change layer 66 (described later), and may be formed with a thickness of, for example, about 10 nm. Thus, thicknesses of the first and second magnetic layers 58 and 62 and the non-magnetic layer 59 may be determined in consideration of, or based on, the total thickness thereof. Further, the magnetic resistance layer may be formed of a giant magnetic resistance layer as above, but may be formed of either one of a tunnel magnetic resistance (TMR) layer, a colossal magnetic resistance (CMR) layer or the like.

Figure 11:
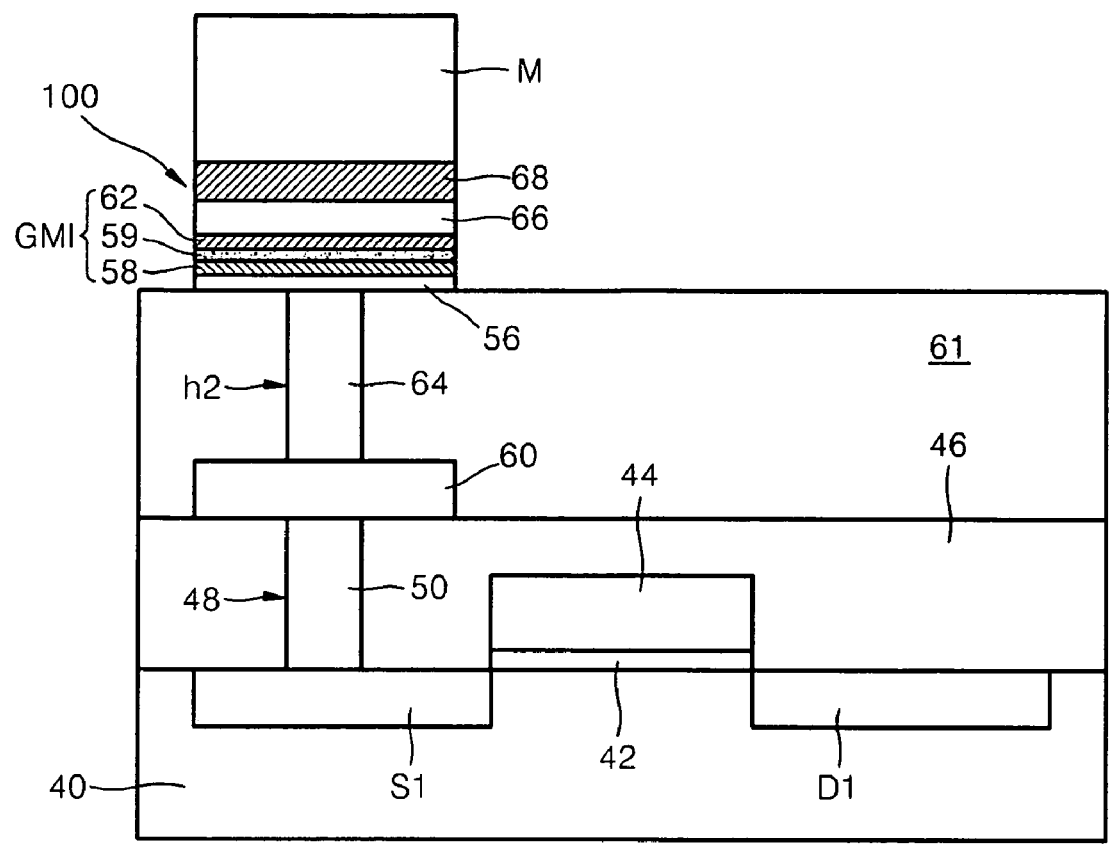

A second phase change layer 66 may be formed on an upper surface of the second magnetic layer 62. The second phase change layer 66 may be formed of the same or substantially the same material layer as that of the first phase change layer 56, but may have a thickness greater than the first phase change layer 56. An upper electrode 68 may be formed on an upper surface of the second phase change layer 66. A photoresistive layer pattern M may be formed on a portion of the upper electrode 68. The photoresistive layer pattern M may confine a region where the storage node may be formed. The exposed portion of the upper electrode 68 may be etched using the photoresistive layer pattern M as an etch mask. The etching may be performed until the second insulating interlayer 61 is exposed. As a result, as illustrated in FIG. 11, the first and second phase change layers 56 and 66, the first and second magnetic layers 58 and 62, the non-magnetic layer 59 and the upper electrode 68 around the photoresistive layer pattern M may be removed, and the material layers below the photoresistive layer pattern M may remain. After the etching, the photoresistive layer pattern M may be removed. Thus, a storage node 100 covering the lower electrode contact layer 64 and including the magnetic resistance layer GM1 may be formed on the second insulating interlayer 62.

Figure 12:
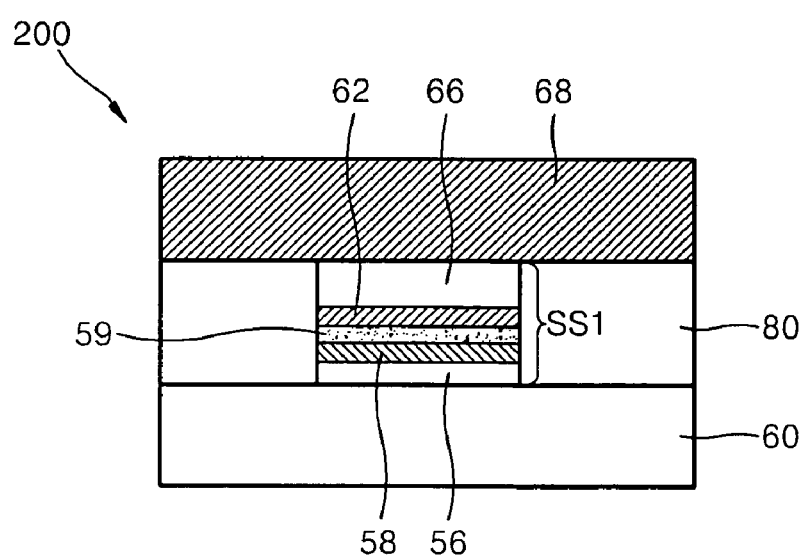
FIG. 12 is a sectional view illustrating a storage node of a phase change memory device, according to another example embodiment.

The storage node 100 may be replaced with a storage node 200 illustrated in FIG. 12.

FIG. 12 illustrates a storage node, according to another example embodiment. Referring to FIG. 12, a first phase change layer 56, a first magnetic layer 58, a non-magnetic layer 59, a second magnetic layer 62 and a second phase change layer 66, may be formed (e.g., sequentially) on a portion of a lower electrode 60 to form a stack structure SS1. An insulating layer 80 may be disposed on the lower electrode 60 around the stack structure SS1, and an upper electrode 68 covering the stack structure SS1 and an upper surface of the insulating layer 80 may be disposed on the insulating layer 80.

A method for fabricating a storage node 200, according to an example embodiment will now be described.

The first phase change layer 56, the first magnetic layer 58, the non-magnetic layer 59, the second magnetic layer 62 and the second phase change layer 66 may be stacked (e.g., sequentially) on the first insulating interlayer 46 to cover the lower electrode 60. A photoresistive layer pattern (not shown) may be formed on the second phase change layer 66. The photoresistive layer pattern may be formed to confine a portion of the second phase change layer 66 formed on the lower electrode 60. Using the photoresistive layer pattern as an etch mask, the exposed portion of the second phase change layer 66 may be etched, and by changing etch conditions in accordance with layers, the second phase change layer 62, the non-magnetic layer 59, the first magnetic layer 58 and the first phase change layer 56 may be etched (e.g., sequentially). The etching may be performed until the lower electrode 60 is exposed and the first phase change layer 56, the first magnetic layer 58, the non-magnetic layer 59, the second magnetic layer 62 and the second phase change layer 66 around the photoresistive layer pattern may be removed. After etching, the photoresistive layer pattern may be removed.

The stack structure SS1 is formed on the lower electrode 60 as illustrated in FIG. 12.

After forming the stack structure SS1, the insulating layer 80, covering the lower electrode 60 and the stack structure SS1, may be formed on the first insulating interlayer 46. The insulating layer 80 may be formed with a thickness greater than that of the stack structure SS1. The upper surface of the insulating layer 80 may be polished until the stack structure SS1 is exposed. In another example embodiment, the insulating layer 80 may surround and/or cover the stack structure SS1.

After the stack structure SS1 is exposed by polishing, an upper electrode 68 may be formed on the polished insulating layer 80 to cover the exposed portion of the stack structure SS1. A photoresistive layer pattern (not shown) may be formed on the upper electrode 68 to cover the stack structure SS1, and an exposed portion of the upper electrode 68 may be etched using the photoresistive layer pattern as an etch mask. After etching, the photoresistive layer pattern may be removed to form the storage node 200.

In the storage node 200 of FIG. 12, the first magnetic layer 58, the non-magnetic layer 59 and the second magnetic layer 62 may form a magnetic resistance layer, and the magnetic resistance layer may satisfy the thickness condition as discussed above with respect to FIG. 10. The magnetic resistance layer may be any one of a giant magnetic resistance layer, a tunnel magnetic resistance layer, a colossal magnetic resistance layer or the like.

Many descriptions have been made in specific, but these descriptions must be understood as examples rather than defining the scope. For example, it is apparent to those skilled to this art that the structure of the storage node may be made different from the structure as described above. Further, the first and second magnetic layers 58 and 62 may be composed of materials other than the magnetic materials described as above. Further, the first magnetic layer 58 may be formed only on a portion of the upper surface of the first phase change layer 56 rather than formed on the overall upper surface of the first phase change layer 56, and another portion of the upper surface may be covered with an insulating layer. The second magnetic layer 62 may be formed on only a portion of the upper surface of the non-magnetic layer 59. Therefore, the scope must be defined by the spirit of following claims not by the example embodiments described as above.

As described above, the phase change memory device, according to example embodiments may include a magnetic resistance layer, a resistance of which may increase concurrently with a reset current applied between the first and second phase change layers of the storage node. Therefore, in a memory device according to at least some example embodiments, as generated heat in the magnetic resistance layer increases, data may be recorded even though a lower reset current than that of the related art is applied.

In at least some example embodiments, size of a transistor may be reduced and/or integration density may be increased because the requisite reset current may be reduced. Further, because the reduction of the reset current is not caused by a size reduction of the lower electrode contact layer, the reduction of the reset current may not influence a set resistance.

While example embodiments have been particularly shown and described with reference to the drawings, it will be understood by those of ordinary skill in the art that various changes in form and details may be made therein without departing from the spirit and scope of the present invention as defined by the following claims.

What is claimed is:

1. A phase change memory device comprising:
a switching element formed in a substrate; and
a storage node connected to the switching element, the storage node including,
a lower electrode connected to the switching element,
a first phase change layer formed on the lower electrode,
a magnetic resistance layer formed on the first phase change layer,
a second phase change layer formed on the magnetic resistance layer, and
an upper electrode formed on the second phase change layer.

2. The phase change memory device of claim 1, further including a lower electrode contact layer formed between the lower electrode and the first phase change layer.

3. The phase change memory device of claim 1, wherein a thickness of the magnetic resistance layer is about 5% through about 50% of a total thickness from the first phase change layer to the second phase change layer including the magnetic resistance layer.

4. The phase change memory device of claim 1, wherein the magnetic resistance layer includes,
a first magnetic layer disposed on the first phase change layer,
a non-magnetic layer disposed on the first magnetic layer, and
a second magnetic layer disposed on the non-magnetic layer.

5. The phase change memory device of claim 4, wherein the second magnetic layer has a greater coercive force than the first magnetic layer.

6. The phase change memory device of claim 1, wherein the first phase change layer, the magnetic resistance layer and the second phase change layer are stacked on a portion of an upper surface of the lower electrode, and a remaining portion of the upper surface of the lower electrode is covered with an insulating layer.

7. The phase change memory device of claim 6, wherein the upper electrode is formed on the insulating layer to cover the second phase change layer.

8. The phase change memory device of claim 2, wherein the lower electrode contact layer contacts the first phase change layer at a position spaced from a central portion of the first phase change layer.

9. The phase change memory device of claim 4, wherein the first magnetic layer is a ferromagnetic layer.

10. The phase change memory device of claim 4, wherein the first magnetic layer is a layer selected from a group consisting of a Co layer, a Fe layer, a NiFe layer and a CoFe layer.

11. The phase change memory device of claim 4, wherein the non-magnetic layer is a layer selected from a group consisting of a phase change material layer, a copper (Cu) layer and a chrome (Cr) layer.

12. The phase change memory device of claim 4, wherein the second magnetic layer is a ferromagnetic layer.

13. The phase change memory device of claim 4, wherein the second magnetic layer is a layer selected from a group consisting of a SmCo layer, a SmFe layer, a NdFeB layer and a NdFe layer.

14. The phase change memory device of claim 1, wherein the magnetic resistance layer is a layer selected from a group consisting of a giant magnetic resistance (GMR) layer, a tunnel magnetic resistance (TMR) layer and a colossal magnetic resistance (CMR) layer.

15. A method of operating the phase change memory device of claim 1, the method comprising:
maintaining the switching element in an on-state; and
applying a voltage between the lower electrode and the upper electrode.

16. The method of claim 15, wherein the voltage is a write voltage causing a reset current to flow between the upper electrode and the lower electrode.

17. The method of claim 15, wherein the voltage is an erase voltage causing a set current to flow between the upper electrode and the lower electrode.

18. The method of claim 15, wherein the voltage is a read voltage for measuring a resistance of the storage node and reading data recorded in the storage node.

19. The method of claim 18, further including,
measuring the resistance of the storage node by applying the read voltage,
comparing the measured resistance with a reference resistance, and
reading the data recorded in the storage node based on the comparison.

20. A method of fabricating a phase change memory device comprising:
forming a switching element in a substrate;
forming a first insulating interlayer covering the switching element on the substrate;
forming a contact hole exposing the switching element in the first insulating interlayer, and filling the contact hole with a conductive plug;
forming a lower electrode covering the conductive plug on the first insulating interlayer;
forming a second insulating interlayer covering the lower electrode on the first insulating interlayer;
forming a via hole exposing the lower electrode in the second insulating interlayer, and filling the via hole with a lower electrode contact layer; and
forming a first phase change layer, a magnetic resistance layer, a second phase change layer and an upper electrode covering the lower electrode contact layer on the second insulating interlayer.

21. The method of claim 20, wherein the first phase change layer is formed such that the lower electrode contact layer contacts the first phase change layer at a position spaced from a central portion of the first phase change layer.

22. The method of claim 20, wherein the magnetic resistance layer is formed by sequentially stacking a first magnetic layer, a non-magnetic layer and a second magnetic layer on the first phase change layer.

23. The method of claim 22, wherein the first magnetic layer is a ferromagnetic layer.

24. The method of claim 22, wherein the first magnetic layer is a layer selected from the group consisting of a Co layer, a Fe layer, a NiFe layer and a CoFe layer.

25. The method of claim 22, wherein the non-magnetic layer is a layer selected from a group consisting of a phase change material layer, a copper (Cu) layer and a chrome (Cr) layer.

26. The method of claim 22, wherein the second magnetic layer is a ferromagnetic layer.

27. The method of claim 22, wherein the second magnetic layer is a layer selected from a group consisting of a SmCo layer, a SmFe layer, a NdFeB layer and a NdFe layer.

28. The method of claim 22, wherein the magnetic resistance layer is formed with a thickness of about 5% through about 50% of a total thickness from the first phase change layer to the second phase change layer including the magnetic resistance layer.

29. The method of claim 20, wherein the magnetic resistance layer is a layer selected from a group consisting of a giant magnetic resistance (GMR) layer, a tunnel magnetic resistance (TMR) layer and a colossal magnetic resistance (CMR) layer.

30. A method of fabricating a phase change memory device comprising:
forming a switching element in a substrate;
forming a first insulating interlayer covering the switching element on the substrate;
forming a contact hole exposing the switching element in the first insulating interlayer, and filling the contact hole with a conductive plug;
forming a lower electrode covering the conductive plug on the first insulating interlayer;
forming a first phase change layer, a magnetic resistance layer and a second phase change layer on a portion of an upper surface of the lower electrode;
forming an insulating layer covering the lower electrode, and covering the first phase change layer, the magnetic resistance layer and the second phase change layer on the first insulating interlayer;
polishing an upper surface of the insulating layer until the second phase change layer is exposed; and
forming an upper electrode covering the second phase change layer on the polished insulating layer.

31. The method of claim 30, wherein the first phase change layer is formed such that the lower electrode contacts the first phase change layer at a position spaced from a central portion of the first phase change layer.

32. The method of claim 30, wherein the magnetic resistance layer is formed by sequentially stacking a first magnetic layer, a non-magnetic layer and a second magnetic layer on the first phase change layer.

33. The method of claim 32, wherein the first magnetic layer is a ferromagnetic layer.

34. The method of claim 32, wherein the first magnetic layer is a layer selected from a group consisting of a Co layer, a Fe layer, a NiFe layer and a CoFe layer.

35. The method of claim 32, wherein the non-magnetic layer is a layer selected from a group consisting of a phase change material layer, a copper (Cu) layer, and a chrome (Cr) layer.

36. The method of claim 32, wherein the second magnetic layer is a ferromagnetic layer.

37. The method of claim 32, wherein the second magnetic layer is a layer selected from a group consisting of a SmCo layer, a SmFe layer, a NdFeB layer and a NdFe layer.

38. The method of claim 30, wherein the magnetic resistance layer is formed with a thickness of about 5% through about 50% of a total thickness from the first phase change layer to the second phase change layer including the magnetic resistance layer.

39. The method of claim 30, wherein the magnetic resistance layer is a layer selected from a group consisting of a giant magnetic resistance (GMR) layer, a tunnel magnetic resistance (TMR) layer and a colossal magnetic resistance (CMR) layer.

* * * * *